(12) United States Patent
Bae et al.

(10) Patent No.: US 6,825,091 B2
(45) Date of Patent: Nov. 30, 2004

(54) SEMICONDUCTOR MEMORY DEVICE AND METHOD OF MANUFACTURING SAME

(75) Inventors: Ki-Soon Bae, Seoul (KR); Hoon-Chi Lee, Yongin-shi (KR)

(73) Assignee: Samsung Electronics Co., Ltd., Kyungki-do (KR)

(*) Notice: Subject to any disclaimer, the term of this patent is extended or adjusted under 35 U.S.C. 154(b) by 0 days.

(21) Appl. No.: 10/369,717

(22) Filed: Feb. 21, 2003

(65) Prior Publication Data
US 2003/0134467 A1 Jul. 17, 2003

Related U.S. Application Data

(62) Division of application No. 09/755,086, filed on Jan. 8, 2001, now Pat. No. 6,548,851.

(30) Foreign Application Priority Data
Jan. 26, 2000 (KR) .......................................... 2000/3625

(51) Int. Cl.[7] .............................................. H01L 21/20
(52) U.S. Cl. ................... 438/382; 438/239; 438/240; 438/253; 438/238; 438/384; 438/396; 438/387
(58) Field of Search ................................ 438/239, 240, 438/253, 287, 396, 238, 384, 385, 209, 382, 387; 257/306, 310

(56) References Cited

U.S. PATENT DOCUMENTS

| | | | |
|---|---|---|---|
| 5,377,139 A | * | 12/1994 | Lage et al. ................... 365/154 |
| 5,385,863 A | | 1/1995 | Tatsumi et al. |
| 5,618,749 A | * | 4/1997 | Takahashi et al. ........... 438/384 |
| 5,786,250 A | * | 7/1998 | Wu et al. ..................... 438/254 |
| 6,040,596 A | * | 3/2000 | Choi et al. ................... 257/306 |
| 6,172,389 B1 | | 1/2001 | Sakoh |
| 6,458,645 B2 | * | 10/2002 | DeBoer et al. .............. 438/240 |
| 6,500,724 B1 | * | 12/2002 | Zurcher et al. .............. 438/384 |

FOREIGN PATENT DOCUMENTS

JP          8-274 274          10/1996          ................. 257/296

* cited by examiner

Primary Examiner—Maria F. Guerrero
(74) Attorney, Agent, or Firm—Lee & Sterba, P.C.

(57) ABSTRACT

A semiconductor memory device and a method of manufacturing same, wherein landing pads are formed to contact source/drain regions of an access transistor in a memory cell array area and a first resistor device is formed in the peripheral circuit area, by depositing a first conductive layer on a semiconductor substrate having an access transistor formed thereon and patterning the first conductive layer. An interlayer insulation layer is deposited on the resultant structure, and a lower electrode and a dielectric layer having a high dielectric constant of a capacitor are formed to contact the source/drain region of the access transistor. By depositing a second conductive layer on the resultant structure having the dielectric layer and patterning the dielectric layer, a capacitor upper electrode is formed in the memory cell array area and a second resistor device is formed in the peripheral circuit area.

13 Claims, 4 Drawing Sheets

SEMICONDUCTOR MEMORY DEVICE AND METHOD OF MANUFACTURING SAME

This application is a Division of application Ser. No. 09/755,086, filed Jan. 8, 2001 now U.S. Pat. No. 6,548,851.

PRIORITY

This application claims priority to an application entitled "Semiconductor Memory Device and Manufacturing Method Thereof" filed in the Korean Industrial Property Office on Jan. 20, 2000, and assigned Ser. No. 2000-3625, the contents of which are hereby incorporated by reference.

BACKGROUND OF THE INVENTION

1. Field of the Invention

The present invention relates to a semiconductor memory device and to a method of manufacturing the same. More particularly, the present invention relates to a semiconductor memory device and a method of manufacturing the same wherein the level of integration is increased and a resistor device maintains sufficient length.

2. Description of the Related Art

Semiconductor devices are largely divided into two categories: a volatile memory RAM (Random Access Memory) and a nonvolatile memory ROM (Read Only Memory). In a DRAM (Dynamic Random Access Memory), a variation of a RAM, a unit cell is comprised of one access transistor and one capacitor. A DRAM additionally includes a memory cell area where a plurality of memory cells are regularly arranged in X and Y directions and a peripheral circuit area formed near the cell array area to drive and control the memory cells. These memory cells are driven by selecting a column signal line, called a word line, and a row signal line, called a bit line. Various devices are formed in the peripheral circuit area such as transistors, diodes, and resistor devices. A conductive layer or a transistor is used as a resistor device.

In conventional technology, when a polysilicon gate is used, it is used as a resistor device using a metal contact or a bit line contact. Since a polycide gate stacked with polysilicon and a metal silicide was used to reduce the resistance of the gate, the low unit sheet resistance of the gate renders the gate unsuitable for a resistor device. Therefore, a polysilicon plate electrode of a capacitor is currently used as a resistor device.

FIG. 1 is a sectional view illustrating a cell array area and a peripheral circuit area in a conventional DRAM device known in the prior art.

Referring initially to FIG. 1, a gate area, including a gate insulation layer (not shown), a polysilicon layer 14, a metal silicide film 16 and a spacer insulation layer 18, is formed in the memory cell array area of a semiconductor substrate 10 having an active region and a field region defined thereon by a field oxide film 12. Impurity diffusion regions (not shown) are formed at both sides of the gate area to act as source/drain regions of a transistor, thereby completing an access transistor.

After landing pads 20 and 21 are formed between gate areas, a first interlayer insulation layer 22 is formed by depositing an oxide film, for example. An opening is formed to expose the landing pad 20 in contact with the drain region of the access transistor by photolithography. Then, a bit line is formed by sequentially depositing a polysilicon layer 24, a tungsten silicide 26, and an anti-reflection layer 28.

A second interlayer insulation layer 30 is formed by depositing an oxide film on the resultant structure. Then, an opening is formed to expose the landing pad 21 in contact with the source region of the access transistor. A capacitor is formed by sequentially depositing a hemispherical silicon layer 32 as a lower electrode, an ONO (Oxide-Nitride-Oxide) dielectric layer 34 having a high dielectric constant, and a polysilicon layer 36a as an upper electrode on the resultant structure having the opening. Here, a resistor device 36b having a length A is formed by remaining the polysilicon layer for the upper electrode of the capacitor in the peripheral circuit area. Next, a third interlayer insulation layer 38 is formed by depositing an oxide film on the overall surface of the resultant structure.

As described above, the polysilicon layer that acts as the upper electrode of a capacitor remains in the peripheral circuit area to be used as a resistor device in the conventional technology. The resistor device should have the greatest possible length with respect to the minimum available area to achieve a high resistance necessary for circuit operation, however, this reduces process margin in a subsequent photolithography step for forming a metal connection line. Furthermore, the increased resistor device length increases unit circuit area, which in turn increases the total chip area.

SUMMARY OF THE INVENTION

It is, therefore, a feature of an embodiment of the present invention to provide a semiconductor memory device and a method of manufacturing the same that can increase the level of integration by minimizing the length of a resistor device.

It is another feature of an embodiment of the present invention to provide a semiconductor memory device and a method of manufacturing the same that can ensure a subsequent process margin.

It is an additional feature of an embodiment of the present invention to provide a semiconductor memory device and a method of manufacturing the same that can increase a level of integration, thereby ensuring high resistance required for circuit operation.

The above features can be achieved by providing a method of manufacturing a semiconductor memory device, wherein landing pads are formed to contact a source/drain region of an access transistor in a memory cell array area and a first resistor device is formed in the peripheral circuit area, by depositing a first conductive layer on a semiconductor substrate having an access transistor formed thereon and patterning the first conductive layer. Then, an interlayer insulation layer is formed on the resultant structure and a lower electrode and a dielectric layer having a high dielectric constant of a capacitor are formed to contact the source/drain region of the access transistor. By depositing a second conductive layer on the resultant structure having the dielectric layer and patterning the dielectric layer, a capacitor upper electrode is formed in the memory cell array area and a second resistor device is formed in the peripheral circuit area.

Preferably, the first and second conductive layers are polysilicon layers. It is also preferable that the first and second resistor devices are spaced by a predetermined distance in a horizontal direction.

According to another aspect of an embodiment of the present invention, there is provided a semiconductor memory device having a memory cell array area and a peripheral circuit area. In the semiconductor memory device, a first resistor device is formed in the peripheral circuit area when a landing pad is formed to contact an impurity diffusion region of an access transistor in the memory cell array area. A second resistor device is formed in the peripheral circuit area when a capacitor upper electrode is formed in the memory cell array area.

These and other features of the present invention will be readily apparent to those skilled in the art upon review of the detailed description of the preferred embodiments that follows.

BRIEF DESCRIPTION OF THE DRAWINGS

The above and other features and advantages of the present invention will become more apparent from the following detailed description when taken in conjunction with the accompanying drawings in which.

DETAILED DESCRIPTION OF THE PREFERRED EMBODIMENTS

A preferred embodiment of the present invention will be described hereinbelow with reference to the accompanying drawings. In the following description, well-known functions or constructions are not described in detail since they would obscure the invention in unnecessary detail.

FIGS. 2A to 2D sequentially illustrate sectional views of a method of manufacturing a DRAM device having a memory cell array area and a peripheral circuit area according to a preferred embodiment of the present invention.

Figure 2A:
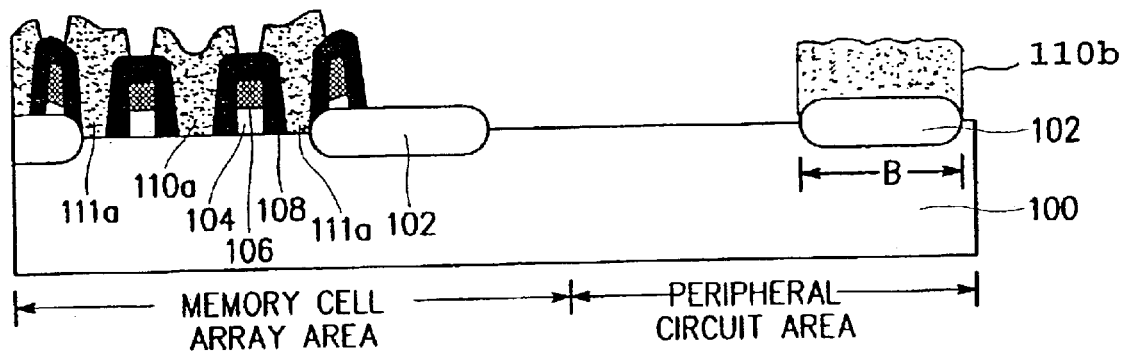
FIGS. 2A to 2D sequentially illustrate sectional views of a method of manufacturing a DRAM device having a memory cell array area and a peripheral circuit area in accordance with a preferred embodiment of the present invention.

Referring now to FIG. 2A, a field oxide film 102 is formed on a semiconductor substrate 100 by a general device isolation process to define an active region and a field region. A gate insulation layer (not shown), a polysilicon layer 104, and a metal silicide layer 106 are sequentially formed on a memory cell array area of the semiconductor substrate 100. A gate area is formed by forming a spacer insulation layer 108 that covers the gate insulation layer, the polysilicon layer 104, and the metal silicide layer 106. Then source/drain regions are formed at both sides of the gate area by general ion implantation, thereby completing an access transistor.

Subsequently, a conductive layer is deposited to a thickness of about 500 to 5000 Å, preferably about 2000 Å, on the semiconductor substrate 100 having the access transistor formed thereon. Landing pads 110a and 111a are formed in the memory cell array area by photolithography. Through the landing pad 110a, a bit line and a capacitor lower electrode that will be formed later are electrically connected to the drain and source region of the access transistor, respectively.

While the conductive layer is used as a landing pad in the memory cell array area only in the conventional technology, the conductive layer partially remains in the peripheral circuit area to act as a first resistor device 110b of length B in the present invention. Preferably, the first resistor device 110b is formed on the field oxide film 102 to prevent damage to the active region during etching. Forming the first resistor device 110b in the peripheral circuit area using the conductive layer for the landing pad ensures high resistance necessary for circuit operation, as compared to a conventional DRAM device known in the prior art.

Figure 2B:
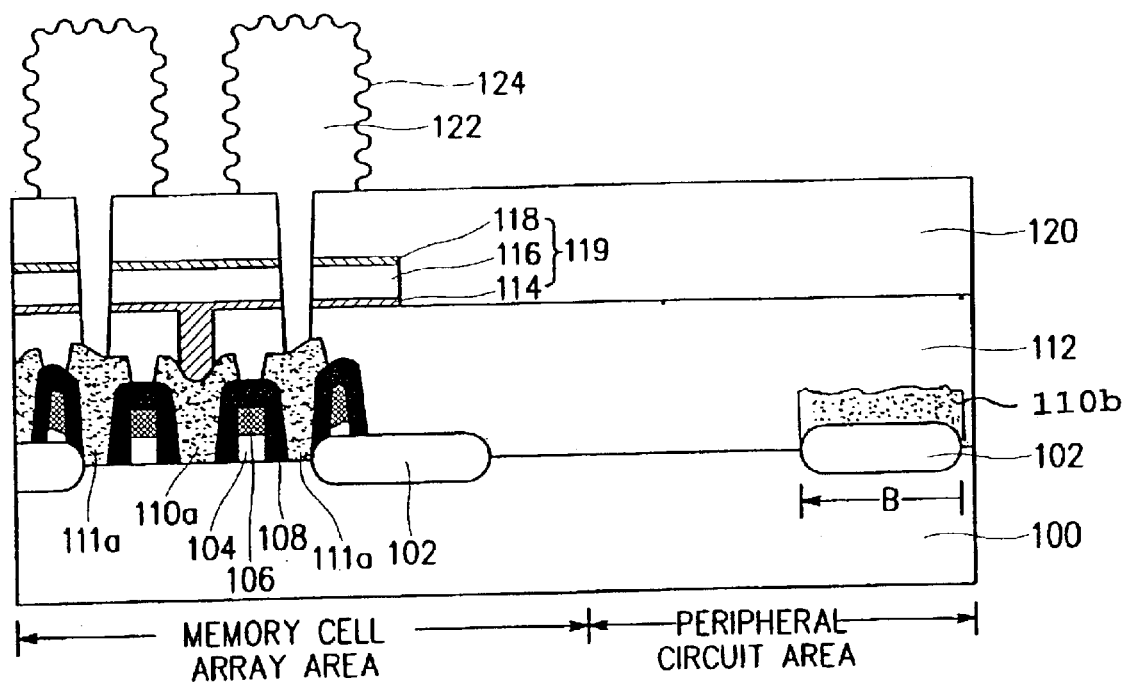

Referring to FIG. 2B, a first interlayer insulation layer 112 is formed by depositing a PSG (Phosphorus Silicon Glass), BPSG (Boron Phosphorus Silicon Glass), or USG (Undoped Silicon Glass) on the overall surface of the semiconductor substrate 100 having the first resistor device 110b formed thereon by CVD (Chemical Vapor Deposition). After an opening is formed to expose the landing pad 110a in contact with the drain region of the access transistor, a bit line 119 is formed by sequentially forming a polysilicon layer 114, a tungsten silicide layer 116, and an anti-reflection layer 118. Then, a second interlayer insulation layer 120 is formed by depositing a PSG, BPSG, or USG on the resultant structure having the bit line 119 by CVD and an opening is formed by photolithography to expose the landing pad 111a in contact with the source region of the access transistor. Thereafter, a storage electrode is formed as a lower electrode of a capacitor by depositing a doped polysilicon on the resultant structure having the opening and patterning the polysilicon. Preferably, an HSG (Hemi-Spherical grain) storage electrode 122 is formed with the doped polysilicon pattern in an HSG storage electrode manufacturing method (for further details see "Extended Abstracts of the International Conference on Solid State Device and Materials", pp. 422–24, or U.S. Pat. No. 5,385,863).

Next, a dielectric layer 124 is formed by depositing a material layer having a high dielectric constant, like an ONO layer, on the storage electrode 122.

Figure 2C:
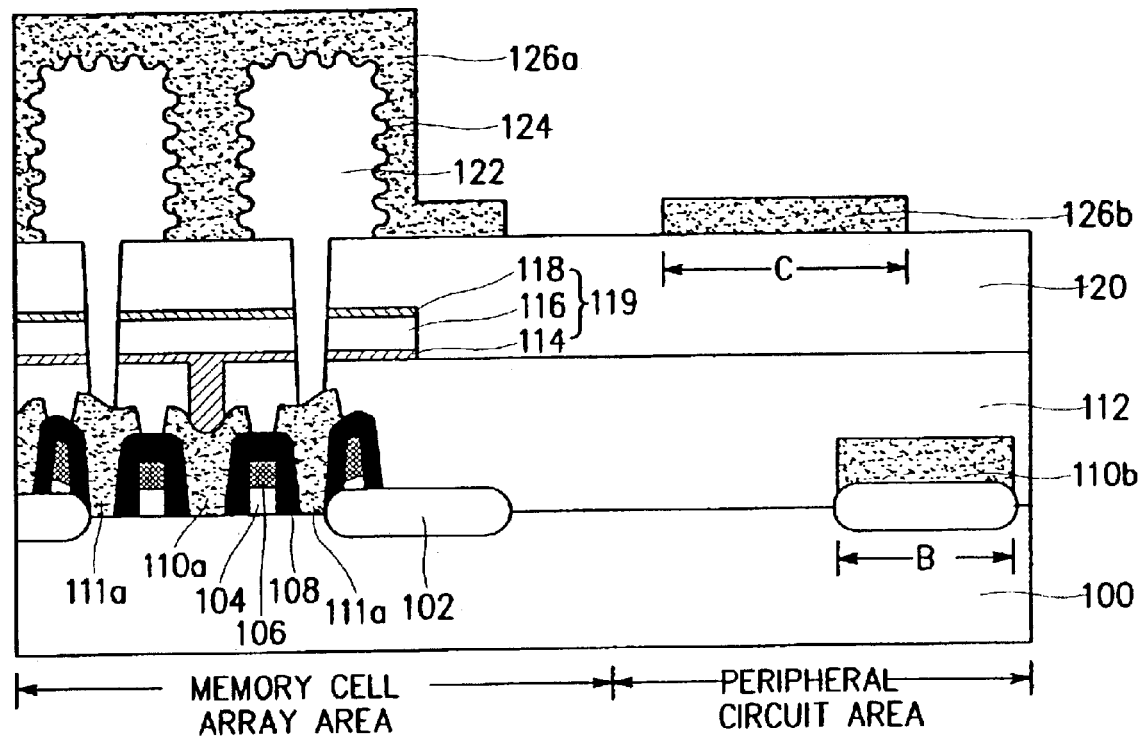

Referring to FIG. 2C, a polysilicon layer is formed to a thickness of about 500–5000 Å, preferably about 2000 Å on the resultant structure including the dielectric layer 124. A plate electrode 126a is formed to act as the upper electrode of the capacitor by subjecting the polysilicon layer to photolithography.

Using the polysilicon layer for the plate electrode 126a, a second resistor device 126b of length C is formed in the peripheral circuit area. It is preferable to form the first and second resistor devices 110b and 126b apart from each other and separated by a predetermined distance in a horizontal direction because there should be a connection between the resistor devices 110b and 126b.

Figure 1:
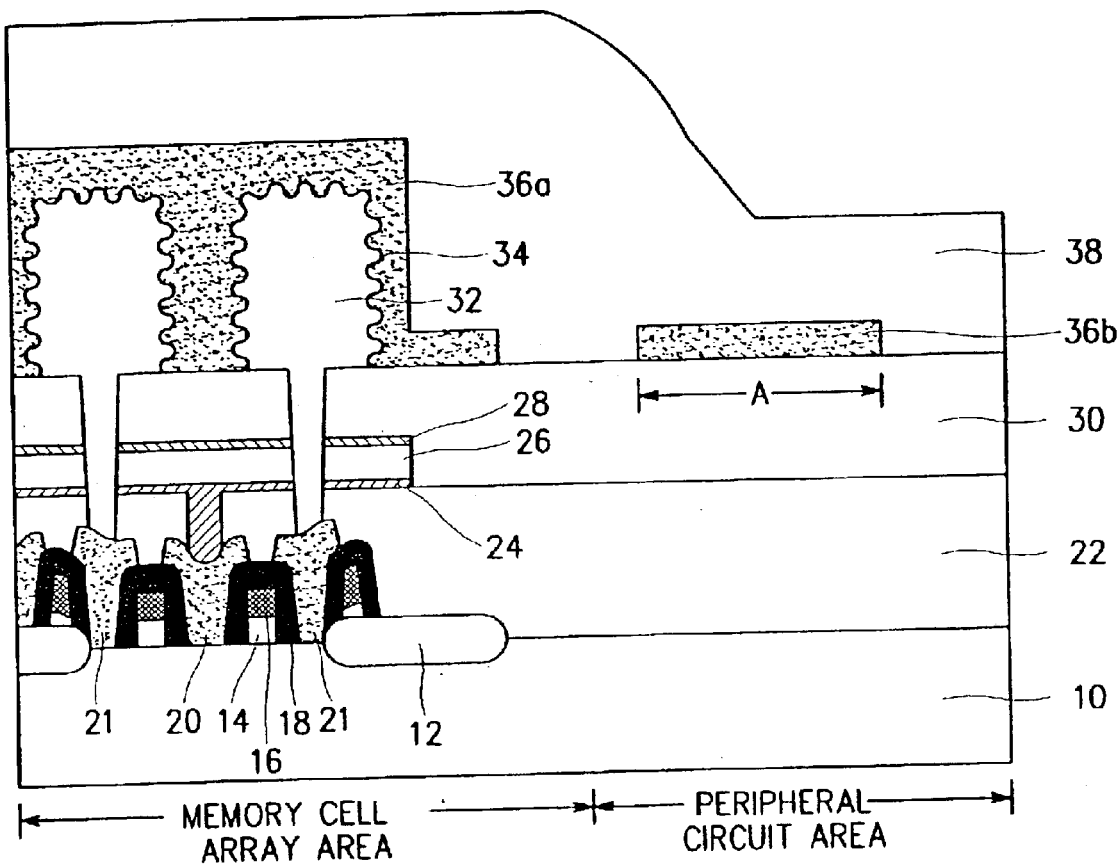
FIG. 1 illustrates a sectional view of a cell array area and a peripheral circuit area in a conventional DRAM device known in the prior art.

Since the first resistor device 110b was formed in the peripheral circuit area when the landing pads 110a and 111a were formed, the same or a higher resistance can be achieved even if the second resistor device 126b is formed shorter than a conventional resistor device 36b (see FIG. 1). In addition, the integration level of semiconductor devices decreases in the conventional technology because the resistor device is made longer when necessary to achieve high resistance necessary for circuit operation. On the contrary, in the present invention, formation of two resistor devices ensures the required high resistance and increases the level of integration of the semiconductor device.

If the length of the conventional resistor device 36b, A, is equal to the length of the second resistor device 126b of the present invention, C, the first resistor device 110b provides a higher resistance than the conventional resistor device 36b. Even if the length of the second resistor device 126b, C, is smaller than the length of the conventional resistor device 36b, A, resistance as much as the length decrement of the second resistor device 126b can be compensated for through the first resistor device 110b. Therefore, the present invention is favorable for high integration of semiconductors.

Figure 2D:
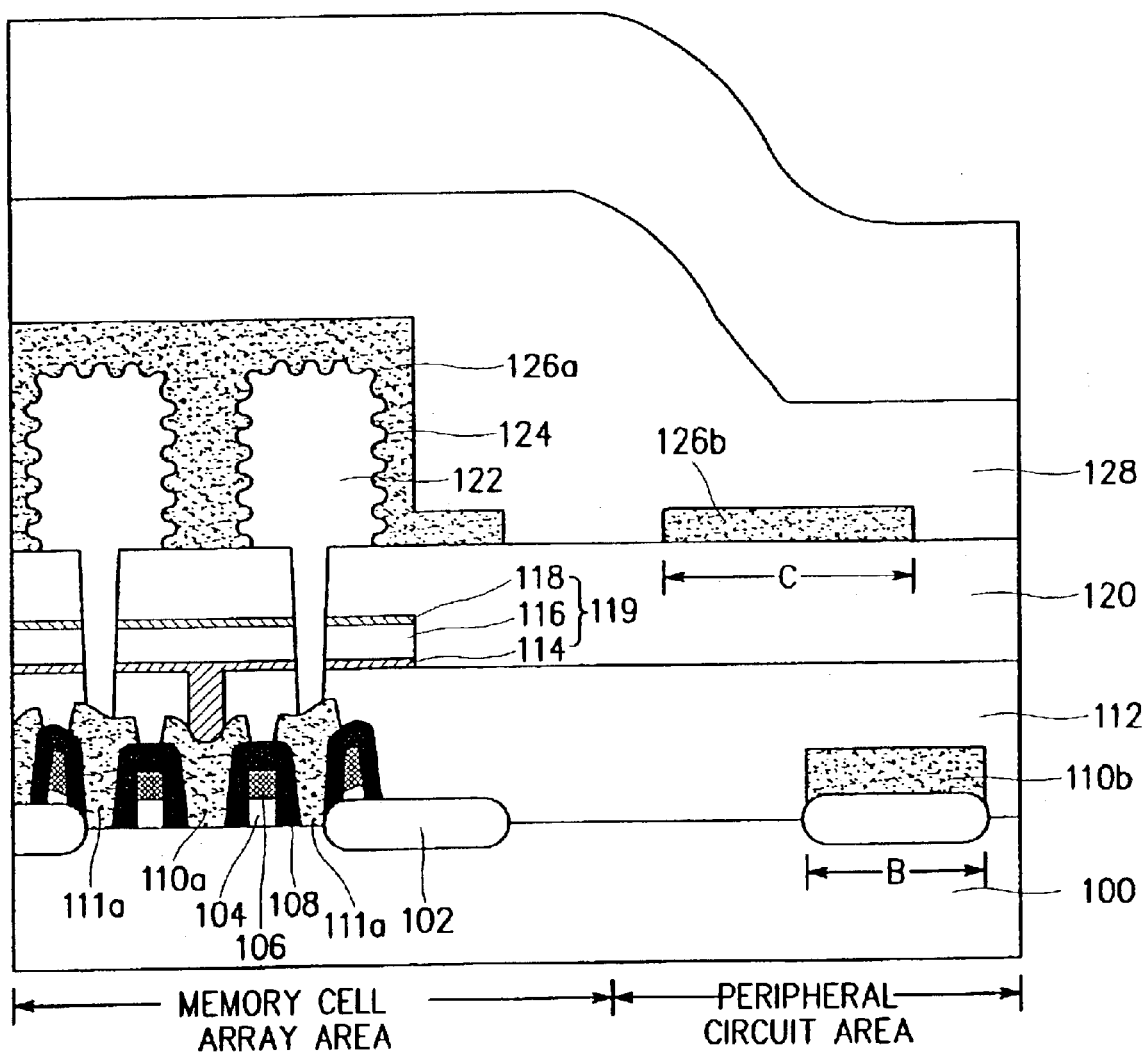

Referring to FIG. 2D, a third interlayer insulation layer 128 is formed by depositing a PSG, BPSG, or USG on the overall surface of the resultant structure including the first and second resistor devices 110b and 126b.

In accordance with an alternate embodiment of the present invention as described above, a first resistor device is formed in a peripheral circuit area using a conductive layer for forming a landing pad in a memory cell array area and a second resistor device is formed in the peripheral circuit area using a conductive layer for forming an upper electrode of a capacitor. By controlling the length of each of the two resistor devices, high resistance necessary for circuit operation is obtained and chip area is minimized, thereby contributing to high integration of a semiconductor device. Furthermore, a process margin is ensured in a subsequent step.

While the invention has been shown and described with reference to certain preferred embodiments thereof, it will be understood by those skilled in the art that various changes or modifications in form and details may be made without departing from the spirit and scope of the invention as claimed.

What is claimed is:

1. A method of manufacturing a semiconductor memory device having a memory cell array area and a peripheral circuit area, comprising:

forming landing pads to contact a source/drain region of an access transistor in the memory cell array area;

forming a first resistor device directly on a field oxide in the peripheral circuit area by depositing a first conductive layer on a semiconductor substrate having an access transistor formed thereon and patterning the first conductive layer, forming an interlayer insulation layer on the patterned first conductive layer;

forming a capacitor lower electrode to contact the source/drain region of the access transistor and forming a dielectric layer having a high dielectric constant on the capacitor lower electrode in the memory cell array area; and forming a capacitor upper electrode in the memory cell array area and a second resistor device in the peripheral circuit area by depositing a second conductive layer on the memory cell array area and the peripheral circuit area and patterning the second conductive layer, wherein the first and second resistor devices overlap in a horizontal direction.

2. The method as claimed in claim 1, wherein the first and second conductive layers are polysilicon layers.

3. The method as claimed in claim 1, further comprising forming a bit line to contact the source/drain region of the access transistor before the step of forming the capacitor lower electrode and the dielectric layer.

4. The method as claimed in claim 1, wherein one of the first and second resistor devices extends beyond the other of the first and second resistor devices in a horizontal direction.

5. The method as claimed in claim 1, wherein the lower electrode is an HSG storage electrode.

6. The method as claimed in claim 1, wherein the first and second resistor devices are about 500–5000 Å thick.

7. The method as claimed in claim 6, wherein the first and second resistor devices are about 2000 Å thick.

8. A method of manufacturing a semiconductor memory device having a memory cell array area and a peripheral circuit area, comprising:

forming a field oxide film on a semiconductor substrate in the memory cell array area and the peripheral circuit area;

forming an access transistor on the semiconductor substrate in the memory cell array area;

depositing and patterning a first conductive layer to simultaneously form landing pads in contact with source and drain regions of the access transistor in the memory cell array area and a first resistor device in contact with the field oxide film in the peripheral circuit area;

depositing a first interlayer insulation layer on the overall surface of the semiconductor substrate having the first resistor and the landing pads formed thereon;

forming a bit line on the first interlayer insulation layer in the memory cell array area in contact with a landing pad;

depositing a second interlayer insulation layer on the overall surface of the semiconductor substrate having the bit line formed thereon;

forming a lower electrode in the memory cell array area in contact with another landing pad; and depositing and patterning a second conductive layer to simultaneously form an upper electrode in the memory cell array area and a second resistor device in the peripheral circuit area, wherein the first and second resistor devices overlap in a horizontal direction.

9. The method as claimed in claim 8, the first and second conductive layers are polysilicon layers.

10. The method as claimed in claim 8, wherein one of the first and second resistor devices extends beyond the other of the first and second resistor devices in a horizontal direction.

11. The method as claimed in claim 8, wherein the lower electrode is an HSG storage electrode.

12. The method as claimed in claim 8, wherein the first and second resistor devices are about 500–5000 Å thick.

13. The method as claimed in claim 12, wherein the first and second resistor devices are about 2000 Å thick.

* * * * *